United States Patent
Stenzel et al.

(10) Patent No.: US 7,736,570 B2
(45) Date of Patent: Jun. 15, 2010

(54) TOOL FOR GENERATING MICROSTRUCTURED SURFACES

(75) Inventors: Volkmar Stenzel, Thedinghausen (DE); Martin Kaune, Bremen (DE); Marta Raquel Da Silva Branco Cheta, Bremen (DE)

(73) Assignee: Fraunhofer-Gesellschaft zur Forderung der Angewandten Forschung E.V., Munich (DE)

( * ) Notice: Subject to any disclaimer, the term of this patent is extended or adjusted under 35 U.S.C. 154(b) by 580 days.

(21) Appl. No.: 10/574,204

(22) PCT Filed: Sep. 30, 2004

(86) PCT No.: PCT/EP2004/052383

§ 371 (c)(1), (2), (4) Date: Feb. 27, 2007

(87) PCT Pub. No.: WO2005/030472

PCT Pub. Date: Apr. 7, 2005

(65) Prior Publication Data

US 2007/0257400 A1    Nov. 8, 2007

(30) Foreign Application Priority Data

Oct. 1, 2003 (DE) ................................ 103 46 124

(51) Int. Cl.
*B29C 59/00* (2006.01)
(52) U.S. Cl. ........................................ 264/293; 264/319
(58) Field of Classification Search ................. 264/319, 264/293, 347, 494, 495; 425/374
See application file for complete search history.

(56) References Cited

U.S. PATENT DOCUMENTS

| 5,480,596 A | * | 1/1996 | Okubo et al. ............ 264/1.33 |
| 2002/0098257 A1 | | 7/2002 | Ikeda et al. |
| 2004/0265058 A1 | * | 12/2004 | Gregg ........................ 404/124 |

FOREIGN PATENT DOCUMENTS

| DE | 196 13 383 | | 8/1997 |
| DE | 19613383 C1 | * | 8/1997 |
| DE | 299 23 870 | | 7/2001 |
| DE | 101 08 469 | | 9/2002 |
| EP | 0 205 289 | | 12/1986 |
| EP | 1 003 078 | | 5/2000 |
| EP | 1 366 888 | | 12/2003 |
| WO | WO 00/30869 | | 6/2000 |

OTHER PUBLICATIONS

English translation of DE 19613383 C1.*
Mehnert, Reiner; Sobottka, A.; Elsner, Ch.: "Microstructured Polyacrylate Surfaces Generated by UV&EB Curing," Proc. RadTech Europe 2001, (Exhibition & Conference for Radiation Curing, Oct. 8-10, 2001, Basle, Switzerland), pp. 603-608.

* cited by examiner

*Primary Examiner*—Kat Wyrozebski
*Assistant Examiner*—Robert J Grun
(74) *Attorney, Agent, or Firm*—Weingarten, Schurgin, Gagnebin & Lebovici LLP (57) ABSTRACT

A tool is described for generating a microstructured surface, comprising:
  a flexible matrix with a negative of the microstructure to be generated
  a pressure roller driveable over a surface, for pressing the matrix onto the surface,
in which the pressure roller and matrix are arranged so that when the roller passes over the surface the matrix executes a rolling movement between the roller and layer, so that the negative of the matrix faces towards the surface, and a device for accelerating the curing of a curable material is arranged so that when the pressure roller passes over the surface it accompanies its movement and acts on a part of the surface.

22 Claims, 5 Drawing Sheets

TOOL FOR GENERATING MICROSTRUCTURED SURFACES

This application is a §371 national phase filing of PCT/EP2004/052383 filed Sep. 30, 2004, and claims priority to a German application No. 103 46 124.8 filed Oct. 1, 2003.

The present invention relates to a tool for generating a microstructured surface, a method for generating an at least partially microstructured surface and an object with a multiply curved and, in the region of the multiple curvature, at least partially microstructured surface, whose microstructure in the region of the multiple curvate can be generated by means of a described tool or method.

Microstructured surfaces are required to an increasing extent for special functions. Surfaces having a lotus leaf structure or flow-promoting surfaces may be mentioned here by way of example. Products that can be optimised as regards speed and energy consumption with flow-promoting, so-called "riblet" surfaces, are in principle objects that on the one hand are self-propelling, such as for example aircraft, tracked vehicles, automobiles, boats or also rotor blades of windpower plants, and on the other hand objects around which or through which a movement is to take place, such as for example pipelines. In addition microstructured surfaces serve to prevent accumulation of dirt or fouling (especially in the case of boats).

Such surface structures are often generated as films by extrusion or imprinting processes, the films then being bonded to the respective workpiece. This method has the following disadvantages:

The bonding of a film to doubly curved surfaces (for example on aircraft wings or rotors for windpower plants) is difficult and sometimes impossible.

The bonding may become detached during operation.

A film adds additional weight to the workpiece. This acts against the intended energy saving, for example in the case of flow-promoting surfaces on vehicles.

In addition a film also occupies volume, which in the case of pipelines leads to a reduced internal volume or the need for an enlarged external volume.

For structuring films imprinting processes are known, which imprint films or film-like materials in stationary machines. For example Reiner Mehnert, A. Sobottka and Ch. Elsner in "Microstructured Polyacrylate Surfaces Generated by UV&EP Curing", Proc. RadTech Europe, 08-10, Basel (2001) 603-608 disclose a device in which a film is guided over a roller whose surface is formed as a matrix. At the same time as the matrix structure is imprinted into the film the (future) surface of the film is cured by irradiating the film with electrons or UV radiation.

A similar device is also disclosed in DE 196 13 383 C1, in which a gelatin film strip is passed between two rollers, one of the rollers having a matrix on its surface.

EP 0 205 289 A1 discloses a process in which again a microstructure is applied to a film by means of a roller.

Common to all three aforementioned processes and devices is that the material whose surface is to be microstructured must be flexible, so that it can be guided over the pressure roller. None of these documents shows any possible way in which a microstructure can be applied to the surface of an inflexible rigid object, such as for example a vehicle part, by means of a roller. In particular the aforementioned devices or methods do not give any indication of how the use of a film could be avoided. An imprinting (i.e. providing a microstructure) of doubly curved rigid surfaces is not possible with the above devices or methods. An additional complicating factor is that—if the imprinting is connected with a simultaneous (partial) curing of the surface that can be microstructured—this curing must take place through irradiation of the respective film since the side of the film that can be microstructured is covered by the matrix and the roller carrying the latter. Such a curing is of course not possible when microstructuring relatively large objects that cannot be through irradiated, for example vehicle parts.

In order to avoid having to use a film, it would in principle be convenient to structure directly a lacquer that is applied for example to vehicle surfaces. An imprinting of the not-yet-cured lacquer by a brief contact with an imprinting tool is however not directly possible in a quality that is sufficient for specific applications (for example a flow-promoting surface) since conventional wet lacquers do not provide a time window within which the lacquer is still formable and on the other hand no longer flows after contact with the imprinting tool. Furthermore the lacquer in the non-fully-cured state is extremely tacky and remains bonded to the imprinting tool when the latter is removed, even if the surface energy of the imprinting tool is extremely low (for example less than 25 mN/M).

Methods for the nanostructuring and microstructuring of lacquers are known, for example in order to produce holograms in the lacquer layer. For example WO 00/30869 discloses a method for the decorative forming of a lacquered substrate surface, in which a lacquer that can be crosslinked by UV radiation is cured through a matrix by means of UV radiation.

Also, a matrix that can be through irradiated is disclosed in the aforementioned DE 196 13 383 C1; the curing of the surface that can be microstructured is carried out by means of UV radiation through the matrix.

However, none of the aforementioned specifications mentions a tool by means of which large and possibly doubly curved surfaces can be microstructured without having to use films or extremely large matrices, or in which (smaller) matrices would constantly have to be applied and removed.

The object of the present invention was accordingly to provide a tool by means of which it is possible with little effort to apply a microstructure also to inflexible materials that cannot be through irradiated, and accordingly in particular to larger surfaces.

According to the invention this object is achieved by a tool for generating a microstructured surface, comprising:

a flexible matrix with a negative of the microstructure to be generated a pressure roller driveable over a surface, for pressing the matrix onto the surface, in which the pressure roller and matrix are arranged so that when the roller passes over the surface the matrix executes a rolling movement between the roller and layer, so that the negative of the matrix faces towards the surface, and a device for accelerating the curing of a curable material is arranged so that when the pressure roller passes over the surface it accompanies its movement and acts on a part of the surface.

In this connection the expression "generating a microstructured surface" is understood to mean the generation of a surface topography that substantially comprises structures with an interspacing and depth in the range from 100 µm to 0.5 µm, preferably 50 µm to 0.5 µm. If the generation is carried out by forming (e.g. imprinting), the error in the forming (deviation from the desired shape) is less than 5 µm, preferably less than 1 µm. This surface may be part of a special layer on a substrate (for example a lacquer on an aircraft wing) or may be formed by the substrate itself. The aforementioned topography is routinely generated by imprinting and—if the imprinted surface is not already dimensionally stable—by subsequent curing.

A "driveable" pressure roller is understood to mean a pressure roller whose centre of gravity can execute a movement on a surface that can be microstructured or on a substrate to which such a surface is applied. Accordingly, a "driving" of the roller over a surface is understood to mean the movement of the centre of gravity of this roller along the aforementioned surface, the roller executing a rolling movement.

Curing within the context of this application is understood to mean an at least partial curing.

The advantage of a device for curing a curable material is that when it is used—assuming that the curable material that is used (for example a lacquer system) is adapted to the action mechanism of the device—a flow of the curable material into which the microstructure has been introduced by the matrix is reduced or even avoided due to the curing.

FIGS. 1 to 5, which are described in more detail hereinbelow, show in each case a diagrammatic representation of a tool according to the invention, the identified light source (5, 5a) being optional in each case, in other words an example of a device for curing a curable material. Accordingly it is possible for example to guide the matrix (a) in the form of an endless strip around only one roller (FIG. 1), two rollers (FIG. 2) or three (see e.g. FIG. 3) or more rollers, or (b) in the form of a single-use strip adapted for example to the length of the surface to be microstructured (in particular for generating non-identically-recurring microstructure patterns) over two (see FIG. 4) or more than two rollers, in which the single-use strip is unwound for example from a first roller and is wound onto a second roller. The person skilled in the art will readily find further possible ways of configuring the tool according to the invention.

The choice of a suitable matrix material is important for the configuration of the tool according to the invention. This material should be able to reproduce exactly structures in the range of less than 20 micrometers, preferably less than 5 micrometers, or even preferably less than 1 micrometer, and in the cured state should preferably have a low surface energy of $\leq 30$ mN/m, preferably $\leq 25$ mN/m, and accordingly not form strong adhesion forces with a cured lacquer, and it should preferably have a Shore hardness of 25 to 50, preferably 25 to 40, and particularly preferably about 27 or about 36. The elasticity corresponding to these Shore hardnesses is particularly suitable for the microstructuring procedure. An increase in the Shore hardness frequently leads to significantly worse microstructuring results since the reduction in elasticity leads in particular to a deterioration of the microstructure of curved surfaces. A reduction of the Shore hardness to below the specified value likewise often leads to a deterioration of the microstructure, since in this way the required force for the forming (imprinting) is no longer transmitted so well to the surface that can be microstructured.

In preferred embodiments the matrix material is transparent and has only a low absorption in the wavelength range of the radiation that is used, in particular UV light, or has a high thermal conductivity in order to transmit thermal energy to the surface that can be microstructured, preferably without thereby undergoing deformation itself.

On the basis of the required properties it will not be difficult for the person skilled in the art also to choose material for matrices that is not explicitly mentioned in the example described hereinafter. The same also applies to the elasticity of the material of the pressure rollers, which the person skilled in the art can easily adapt to that of the matrix material and to the properties of the surfaces that can be microstructured (for example to the radii of curvature, also with multiply curved surfaces, or to the curing properties in the case of a lacquer).

A surface material for the pressure rollers whose Shore hardness is from 20 to 50 is preferred, in particular in connection with the matrix material described in this application. In turn, the pressure rollers preferably have a diameter of 10 to 50 cm and/or a length of 20 to 100 cm.

A significant advantage of a tool according to the invention is that it permits a problem-free and continuous processing of surfaces. Especially when choosing suitable matrix material and/or pressure roller material it is convenient for this purpose also to structure curved, even multiply curved, surfaces. Thus, for example, large structures such as aircraft or tracked vehicles or parts thereof can also be microstructured in regions of doubly curved surfaces. The tool according to the invention, in particular a tool with a surface material for the pressure roller having a Shore hardness of 20 to 50 and preferably with a pressure roller having a diameter of 10 to 50 cm and/or a length of 20 to 100 cm, is accordingly particularly advantageous for microstructuring surfaces or surface sections of aircraft, in particular their wings and fuselage; tracked vehicles, in particular locomotive and carriage bodies; automobiles; ships, in particular their carcasses and propellers; wind energy plants, in particular their rotor blades; turbines, in particular their rotor blades and stator blades; and internal surfaces of pipes, in particular for pipelines. The disadvantages described in the introduction of conventional methods for bonding the surfaces or surface sections that have just been mentioned can thus be avoided or reduced.

Multiply curved surfaces are in connection with this application those surfaces that cannot be covered in a fold-free manner by a continuous microstructured film according to the prior art that can be spread out flat so as to contact the whole surface.

For a successful microstructure it is as a rule also essential to choose a suitable system of curable material, for example a lacquer system. This should ideally provide a time window within which the lacquer is still formable but on the other hand no longer flows after contact with the matrix. At the same time the lacquer should not be so tacky that it remains bonded to the matrix when the latter is removed. Since such an ideal lacquer system is technically complicated to achieve, even approximately, recourse will often be made to lacquer systems that do not exhibit the aforedescribed ideal properties. The decisive factor is that the lacquer underneath the matrix should cure sufficiently so that it no longer adheres to the latter and no longer runs after removal of the matrix. This can also be achieved by using a lacquer system that undergoes a radiation-induced or thermally-induced crosslinking reaction, by means of which the lacquer can be partially or completely crosslinked also underneath the matrix. Such lacquer systems are particularly suitable for use with preferred configurations of the tool according to the invention (further details given hereinafter).

In a preferred embodiment of a tool according to the invention a roller (stripping roller) is installed in such a way that it removes the matrix when the tool is driven over the surface. Essential advantages of such a preferred tool according to the invention are that the shear forces occurring as a result of the rounded configuration of the stripping roller support a stripping of the matrix from the surface that can be microstructured, and that as a rule a separate removal procedure for the matrix is no longer necessary.

Preferably an aforementioned device for accelerating the curing includes a lamp and/or a heating device for irradiating and/or heating the surface that can be microstructured.

It is particularly preferred in this connection if the device for accelerating the curing is a UV light source, since particularly many UV-curable lacquers are available and an irradiation with (UV) light is easy to carry out.

Most particularly preferred is a tool according to the invention in which the device for accelerating the curing is installed in such a way that the curing of the curable material on the surface that can be microstructured is effected by through irradiation or heating of the matrix. Accordingly the curing takes place during operation already while the matrix is still pressed into the surface that can be microstructured, so that a "running" of the microstructure after removal of the matrix can be excluded with proper handling, and a bonding of the curable material to the matrix is avoided.

Preferably the preferred tool according to the invention for the microstructure of a surface is used with a lacquer system that is either a purely radiation-curing or purely thermally-curing system, or with a system that is a combination of (a) thermal and radiation curing or (b) another curing mechanism and [i] radiation curing or (ii) thermal curing. Most particularly preferred in this connection is a two-component so-called dual-cure lacquer system that involves a mixture of two different curing mechanisms:

1. UV curing (free-radical/anionic, cationic polymerisation)
2. polyol/isocyanate crosslinking (polyaddition).

This leads to the following further advantages for the imprinting of the microstructure:

1. It is ensured that the dual-cure lacquer layer is cured also in the region of shade zones in the case of curing by means of UV light.
2. There is the possibility of completely lacquering a substrate (structural part) and subsequently structuring specific zones of the structural part (one-layer lacquering).
3. In the lacquer system a particularly good adhesion to the substrate is achieved by the polyadduct.

An exemplary formulation for such a lacquer system is given hereinafter in the example.

A tool according to the invention and in particular its preferred embodiments preferably comprise a device for applying the curable material to a substrate or to the matrix. With such a device it is particularly possible, depending on the properties of the curable material that is to form the microstructure (for example a lacquer), to match the microstructuring to the curing process of the curable material. Accordingly it is possible to transfer the curable material to the matrix and apply it via the matrix to a substrate. Alternatively it may be appropriate to apply the curable material directly to the substrate and then preferably bring it into contact with the matrix in due course. In both alternatives a surface that can be microstructured (by means of the applied material) is first of all made available. In the present context "in due course" means a time interval that is shorter than the respective curing time for the complete (not only partial) curing of the respective curable material that is to form the microstructure.

A further aspect of the invention relates to the use of the aforedescribed tools for generating a microstructured surface. By using a tool according to the invention to generate a microstructured surface, surfaces can be produced that promote flow particularly well and/or prevent contamination or fouling, in which the disadvantages described in the introduction of conventional microstructuring processes can be avoided or at least reduced. By using a tool according to the invention for generating a microstructured surface, the advantages described above for preferred embodiments and aspects of the tool according to the invention can in particular be achieved.

The tools according to the invention (in particular in their preferred embodiments) are particularly suitable for such a use, since large surfaces, which may also include doubly curved surfaces, can be microstructured with them in a continuous process. This is made possible in particular by a suitable choice of the matrix material and the material for the pressure rollers. The tool is furthermore preferably designed so that it exerts under its own weight the pressure on the curable material that is required for the microstructuring. The pressure may however also be produced by an additionally applied force. This pressure is in particular necessary to remove air bubbles that have possibly formed in the boundary layer between the tool (matrix) and material that can be microstructured.

So that the tool according to the invention can be driven, it is possible by choosing the feed rate to select advantageous imprinting and/or curing conditions for the respectively chosen curable material that is to carry the microstructure. In this connection the tool can be driven continuously or discontinuously over the surface that can be microstructured. In particular, if a suitable matrix material is used it is furthermore possible to use the tool repeatedly, which is preferably designed so that the matrix is replaceable.

In preferred embodiments of the tool, by means of the device for accelerating the curing of the curable material the curing process of the curable material can at the same time be influenced by the tool, in particular by choosing a suitable matrix material and illumination through the matrix.

In addition, with the use according to the invention it is possible to employ lacquer/resin systems as curable material, that can be hardened only under the exclusion of oxygen. These resin systems are in many respects technologically superior to the systems that can also be cured in air, for example with UV radiation. Such lacquer/resin systems provide in particular the following advantages:

- no excess of photoinitiator is necessary, which provides a cost advantage and leads to a better durability of the lacquer/resin film;
- no excess of reactive groups is necessary (for example double bonds), which opens up the possibility of formulating significantly more flexible and less brittle lacquer/resin systems;
- by preventing oxygen inhibition the lacquer/resin film is, in contrast to conventional techniques, also virtually completely crosslinked directly on the surface, which leads to better resistance to chemicals and scratch resistance.

A further aspect of the invention relates to a method for generating an at least partially microstructured surface, comprising the following steps:

a) provision of a surface that can be microstructured,
b) provision of a tool according to the invention (preferably in one of the preferred configurations),
c) microstructuring of the surface by means of the tool.

The preferred modifications of the use according to the invention apply as appropriate as regards the method according to the invention.

Preferably the method according to the invention is carried out using a tool according to the invention, in which a device for accelerating the curing of the curable material is arranged so that when the pressure roller is driven over the surface it accompanies its movement and acts on a (preferably already driven-over) part of the surface and thus cures the surface that can be microstructured. In this way it can be ensured that the microstructure does not run further in the curable material.

Particularly preferred is a method according to the invention in which the curing is carried out by through irradiation or heating the matrix. In this procedure it is possible to cure in situ the microstructure, generated by the matrix, of a surface of a material curable by irradiation or heating, so that running no longer takes place.

Also preferred is a method according to the invention comprising in step b) the provision of a tool according to the invention with a device for applying the curable material to a substrate or to the matrix and the application of a curable material to a substrate or to the matrix by the tool, so that a surface that can be microstructured is provided according to step a).

The advantage of this method lies in the fact that the driving speed and the energy that is imparted to the curable material by the particularly preferred tool according to the invention for curing the said curable material can be optimally adjusted to exactly this material (preferably a lacquer system). In addition application of the curable material (provision of the surface that can be microstructured) and the microstructuring itself can take place in a single workstage.

A further aspect of the invention relates to an object having a multiply curved and, in the region of the multiple curvature, an at least partially microstructured surface, in which the microstructure in the region of the multiple curvature can be generated by means of a tool or method according to the invention (in particular in the respectively preferred embodiments).

Such an object has the advantages of a microstructure, also in surface regions that could not hitherto be microstructured by means of the prior art, without the disadvantages described in the prior art, which are involved in particular with the use of films that carry a microstructure.

The invention is described in more detail hereinafter by means of examples of implementation and with reference to the accompany drawings, in which.

EXAMPLES OF PREFERRED TOOLS ACCORDING TO THE INVENTION (FIGS. 1-5)

In FIGS. 1-5 identical reference numerals are used for elements that substantially correspond to one another as regards their function.

Figure 1:
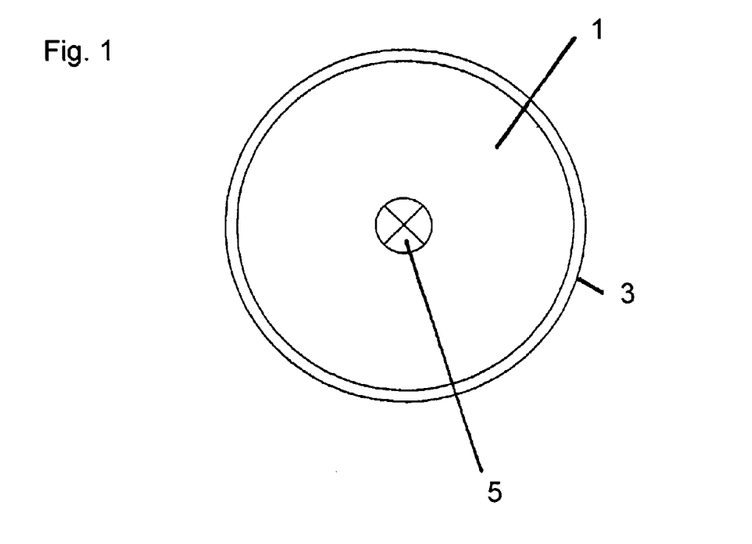
FIG. 1 is a diagrammatic representation of a tool according to the invention, in which the matrix runs in the form of a continuous loop around the pressure roller.

The tool shown in FIG. 1 comprises a pressure roller 1 to which a matrix 3 is applied in the form of a continuous loop. A light source and/or heat source 5 is provided within the pressure roller, which source is installed so that the energy emitted by it can be transmitted through the pressure roller material to the matrix (in the case of heat) or can penetrate through the matrix (in the case of light). In the last-mentioned case the roller material must have a high degree of transmission for the wavelength emitted by the light source.

Figure 2:
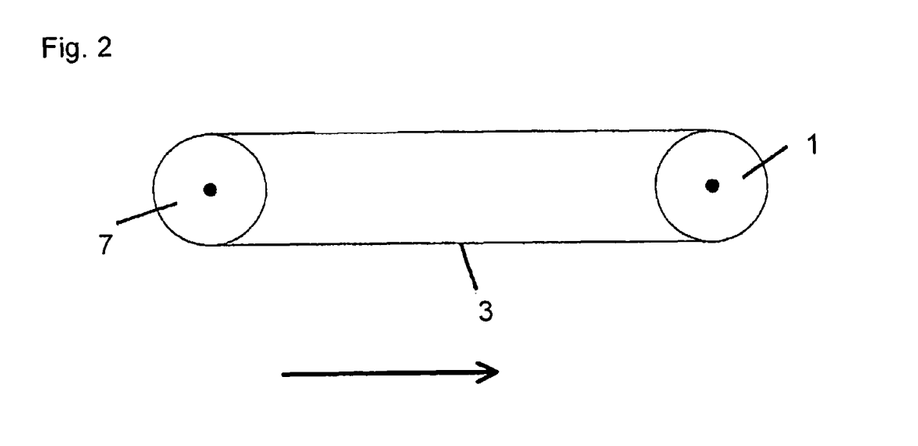
FIG. 2 is a diagrammatic representation of a tool according to the invention, in which the matrix runs in the form of a continuous loop around a pressure roller and a further roller (stripping roller)

A further tool according to the invention, as illustrated in FIG. 2, comprises a pressure roller 1, a matrix 3 that is again formed as a continuous loop, and a roller 7 that simultaneously acts as a stripping roller. In a tool of this arrangement a curing agent (for example a light source) can optionally be applied within the circulating matrix loop or above the circulating matrix loop.

Figure 3:
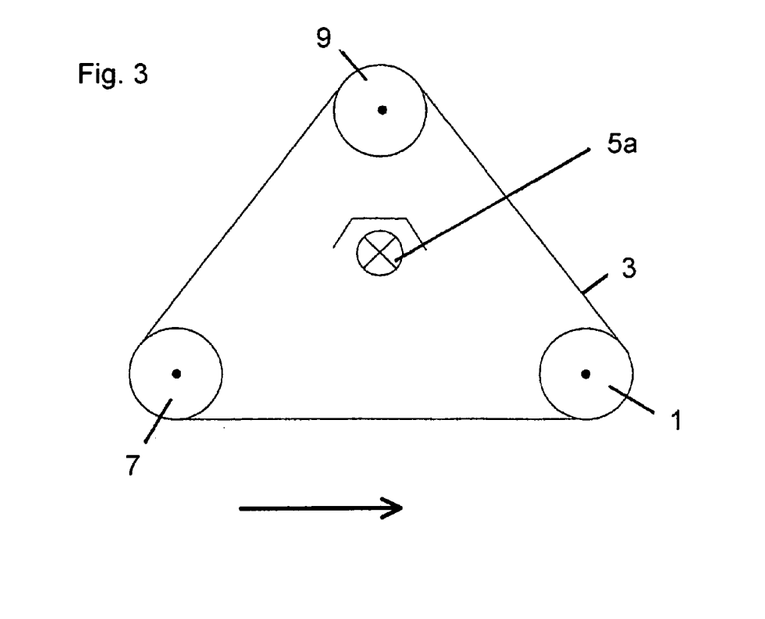
FIG. 3 is a diagrammatic representation of a tool according to the invention, in which the matrix runs in the form of a continuous loop around the pressure roller and two further rollers, one of which acts as a stripping roller.

FIG. 3 shows a tool according to the invention with a pressure roller 1, a matrix 3, a roller 7 that simultaneously acts as stripping roller, and a roller 9 as well as an illumination source with variable distance setting 5a (optional).

Figure 4:
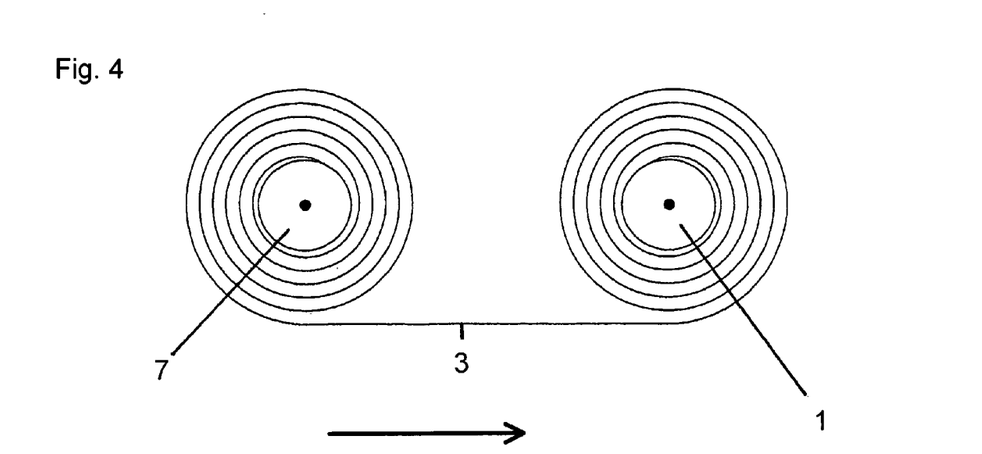
FIG. 4 is a diagrammatic representation of a tool according to the invention, in which the matrix loop is unwound from the pressure roller and is wound onto a stripping roller.

FIG. 4 shows a further embodiment of a tool according to the invention, in which a strip-like matrix 3 is unwound from the pressure roller 1 and is wound onto a roller 7, which at the same time acts as stripping roller.

Figure 5:
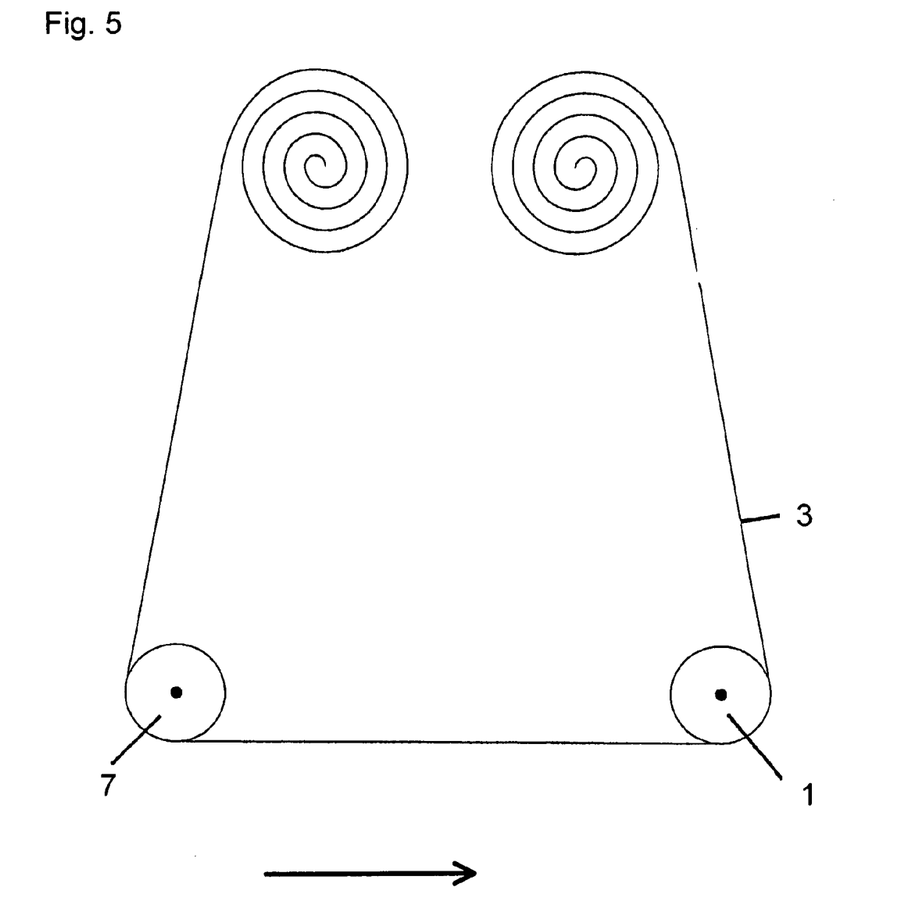
FIG. 5 is a diagrammatic representation of a tool according to the invention, in which the matrix is unwound from a roller, runs over the pressure roller and a stripping roller, and is then rewound.

FIG. 5 shows a further tool according to the invention, in which a strip-like matrix 3 is unwound from a roller (not shown) or the like, guided over a pressure roller 1, and removed again from the surface by a stripping roller 7, before it is once more wound onto a roller (not shown) or the like. As in FIG. 4, the matrix is formed as a continuous loop.

The driving direction corresponds to the direction of the arrow shown in the respective figure. A device for accelerating the curing of the curable material (in some cases not shown) may optionally be installed above or between the rollers (if more than one roller is present). The tools according to the invention may also be designed so that, depending on the driving direction, in each case the same roller can act as pressure roller or stripping roller.

Example of Production of a Tool and Implementation of the Method

For a tool according to the invention that corresponds to the configuration of FIG. 3, including a light source with variable distance adjustment, a matrix was produced as described hereinafter in b) in the form of a continuous loop from a material according to the following sub-point a): the tool produced in this way was used as described in sub-point e), in which a lacquer (lacquer system, see sub-point c)) was microstructured by means of a UV lamp (described in sub-point d)).

a) Material for Producing the Matrix

Figure 6:
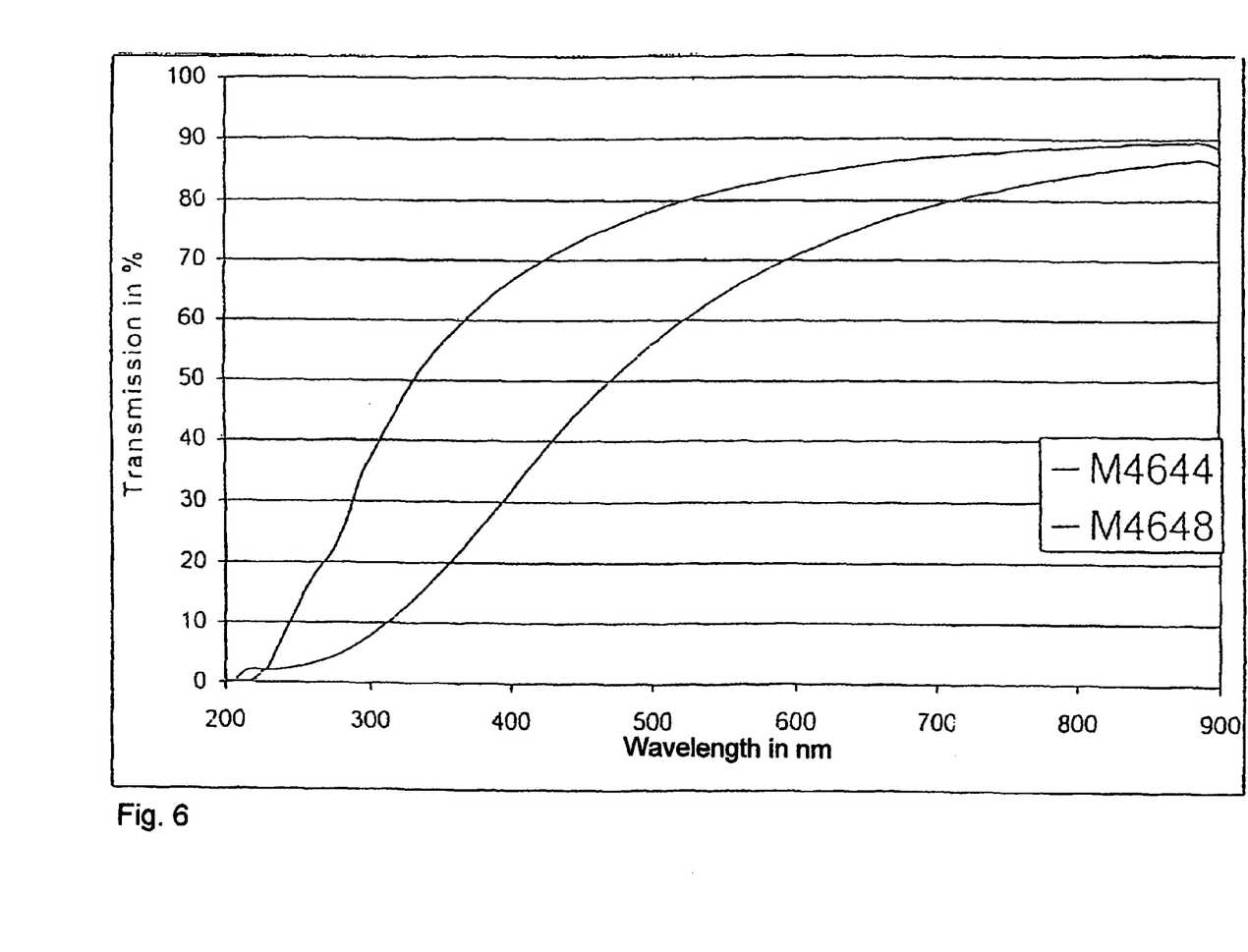
FIG. 6 shows the transmission spectrum of the matrix material Elastosil EL M 4648 used in the example.

A two-component silicone casting composition from the Wacker company and curing on the basis of polyaddition was used. This composition is the transparent two-component silicone casting composition Elastosil EL M 4648 in a mixture ratio of 10 to 1 (component A to component B) from the Wacker company. Specific values of the transmission spectrum of Elastosil EL M 4648 are shown in Table 1 and are plotted in FIG. 6 for purposes of comparison with the casting composition Elastosil EL M 4644 from Wacker.

TABLE 1

| Transmission spectrum of the matrix material Elastosil EL M 4648 | |
|---|---|
| Wavelength [nm] | Transmission [%] |
| 200 | 0.05 |
| 250 | 2.69 |

TABLE 1-continued

Transmission spectrum of the matrix material Elastosil EL M 4648

| Wavelength [nm] | Transmission [%] |
|---|---|
| 300 | 7.93 |
| 350 | 18.36 |
| 400 | 31.64 | b) Production of the Matrix

The matrix should exhibit the known, flow-promoting microstructure that has already been tested for passenger aircraft. For this purpose negative copies of a film with the tested microstructure were prepared by casting this film with the silicone material specified above. In order to ensure an adequate moulding and low crack formation tendency of the matrix, the matrix thickness was adjusted to at least 1 mm. The following procedure was adopted:

The original film (with the tested microstructure) was fixed to a flat substrate.

The aforementioned silicone casting composition was mixed in the aforementioned mixing ratio and aerated by means of apparatus provided for this purpose (in this case a vacuum dissolver).

The silicone casting composition was poured onto the original film in the layer thickness mentioned above.

The curing time was at least 12 hours.

After curing the silicone matrix 3 thereby formed was removed from the original film, assembled to form a continuous loop, and combined with the other constituents of a tool according to the invention, as shown diagrammatically in FIG. 3, to form a tool.

In some cases the silicone casting composition was aerated by means of a vacuum device after applying the casting composition to the original film.

c) Curable Material

For the particular application case a two-component, so-called dual-cure lacquer system was developed, i.e. a lacquer system that can be cured by two different curing mechanisms:

1. UV curing (free-radical/anionic/cationic polymerisation).
2. Polyol-isocyanate crosslinking (polyaddition).

| | Formulations: | | |
|---|---|---|---|
| No. | Raw Material | | wt. % |
| Component A | | | |
| 1 | Desmophen A 870 BA | | 52.6 |
| 2 | Baysilone OL 17 | | 0.50 |
| 3 | Modaflow | | 0.50 |
| 4 | 1-Methoxypropyl acetate-2/Solvesso 100 (1:1) | | 10.50 |
| 5 | Genomer 3364 | | 14.9 |
| 6 | Irgacure 184 | | 0.80 |
| 7 | Irgacure 907 | | 0.15 |
| | | | 80.0 |
| Component B | | | |
| 1 | Desmodur N 3390 | | 20.0 |
| | | | 20.0 |
| Total: | | | 100. |

Figure 7:
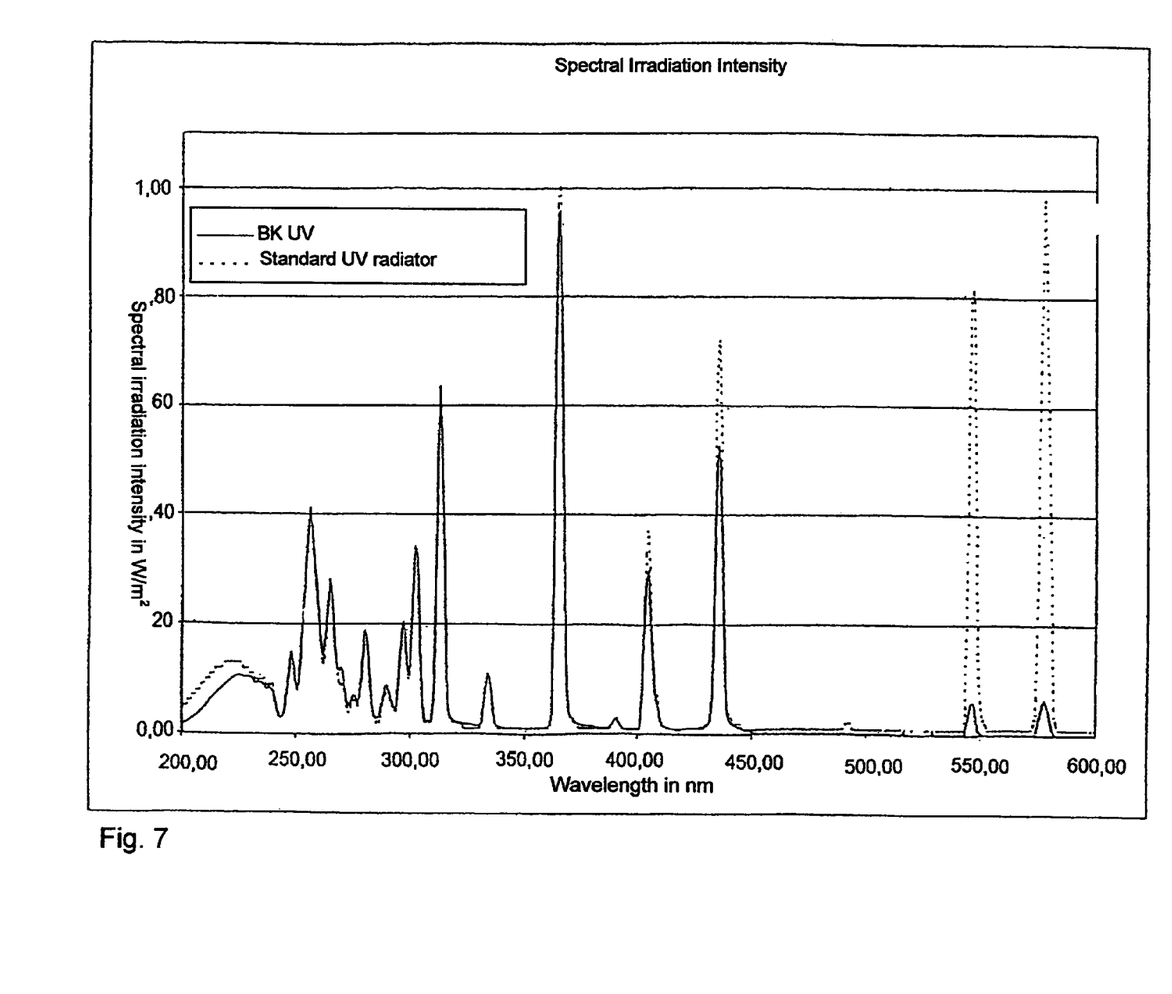
FIG. 7 shows the spectral radiation intensity of the UV radiation source used in the example, compared to a standard UV radiation source.

Component A:
1. Hydroxyl-functional polyacrylate
2. Polyether-modified polysiloxane
3. Flow agent
4. Solvent
5. Modified polyether/polyacrylate
6. Photoinitiator: 2-methyl-1 [4-(methoylthio)phenyl]-2-morpholinopropan-1-one
7. Photoinitiator: 1-hydroxycyclohexylphenyl ketone Component B:
Aliphatic hexamethylene diisocyanate (HDI)
Curing parameters of the lacquer system:
UV curing: Light intensity: 100% (4 kW), $v_{penetration}$=1.4 m/min
NCO crosslinking: at room temperature d.) Radiation Source:

A UV radiation source (5a) was used to cure the UV-sensitive component of the dual-cure lacquer. The apparatus was mounted so as to minimise leakage of UV light and ozone. The radiation source consists of a mercury vapour/metal halide lamp that in operation emits ultraviolet light in the A, B and C ranges. The UV light was deflected by several reflectors and selected for a light spectrum in the UV range from 200 to 400 nm before it exited. The undesired portions of the energy from visible and infrared light from 400 to 4000 nm were dissipated via the cooling housing. FIG. 7 shows the spectral irradiation intensity of the employed UV radiation source (5a) compared to a standard UV radiator. The maximum intensity of the employed UV lamps was 4 kW, and the wavelength distribution of the employed UV light was 200 to 400 nm.

e.) Microstructuring of a Surface of a Substrate and Curing by Means of the Tool:

The aforementioned dual-cure lacquer was coated in an average layer thickness of ca. 70 μm on the substrate of a chromic acid-anodised aluminium sheet of size 10×20 cm provided with epoxy primer. The lacquer layer thickness was thus greater than the depth of the microstructure to be generated. After the application of the lacquer the tool was placed on the lacquer layer (surface) and the air was expelled from the intermediate layer by gentle pressure. The lacquer was then cured by the tool by means of the UV light, wherein the UV light exited from the UV light source and passed through the matrix and onto the lacquer to be cured. The UV lamp was operated at maximum intensity (4 kW) and the tool was driven at a speed of v=1.4 m/min over the surface that can be microstructured, corresponding to the direction of the arrow in FIG. 3. Due to the continuous forward movement of the whole tool and the shear forces acting on the roller 7, the matrix was immediately removed from the lacquer layer after the curing. By using rubber rollers (1, 7, 9) it was possible to microstructure even multiply curved surfaces.

The invention claimed is:

1. Tool for generating a microstructure on a surface, the tool comprising:
   a matrix with a negative of the microstructure to be generated; and
   a pressure roller assembly comprising a first pressure roller, the pressure roller assembly moveably driveable over the surface, the matrix being disposed around the pressure roller assembly for pressing the matrix onto the surface,
   in which:
   the pressure roller assembly and matrix are arranged so that, when a center of gravity of the pressure roller assembly is driven over the surface, the matrix executes a rolling movement between the first pressure roller and the surface, with the negative of the microstructure to be generated facing towards the surface, and
   a device for accelerating the curing of a curable material is coupled to the pressure roller assembly so that when the pressure roller assembly is driven over the surface the curing acceleration device moves along with the pressure roller assembly and the curing acceleration device acts on a part of the surface over which the pressure roller assembly has been driven.

2. Tool according to claim 1, wherein the matrix has a Shore hardness A of 25-40.

3. Tool according to claim 1, wherein a second roller is arranged so that when the tool is driven over the surface the second roller removes the matrix from the surface.

4. Tool according to claim 1, wherein a surface material of the first pressure roller has a Shore hardness A of 20 to 50.

5. Tool according to claim 1, wherein the tool is arranged so that the microstructuring of doubly curved surfaces is permitted.

6. Tool according to claim 1, wherein the device for accelerating the curing comprises a lamp and/or a heating device for irradiating and/or heating the surface that can be microstructured.

7. Tool according to claim 6, wherein the lamp is a UV light source.

8. Tool according to claim 6, wherein the device for accelerating the curing is mounted so that the curing of a curable material on the surface that can be microstructured is effected through irradiation or heating of the matrix.

9. Tool according to claim 1, wherein the tool comprises a device for applying a curable material to a substrate or to the matrix.

10. Method for generating an at least partially microstructured surface, comprising the following steps:
    a) provision of a surface that can be microstructured,
    b) provision of a tool according to claim 1,
    c) microstructuring of the surface by means of the tool.

11. Method according to claim 10, comprising the step of curing by the tool a curable material on the surface that can be microstructured.

12. Method according to claim 11, in which the curing takes place through irradiation or heating of the matrix.

13. Method according to claim 10, comprising the application of a curable material to a substrate or to the matrix by the tool, so that according to step a) a surface that can be microstructured is provided.

14. Object with a multiply curved surface and, in the region of the multiple curvature, an at least partially microstructured surface, wherein the microstructure in the region of the multiple curvature is generated by means of a tool according to claim 1.

15. Tool according to claim 2, wherein:
    a second roller is arranged so that when the tool is driven over the surface the second roller removes the matrix;
    the surface material of the pressure roller has a Shore hardness A of 20 to 50;
    the tool is arranged so that the microstructuring of doubly curved surfaces is permitted;
    the device for accelerating the curing comprises a lamp and/or a heating device for irradiating and/or heating the surface that can be microstructured;
    the lamp is a UV light source;
    the device for accelerating the curing is mounted so that the curing of a curable material on the surface that can be microstructured is effected through irradiation or heating of the matrix; and
    the tool comprises a device for applying a curable material to a substrate or to the matrix.

16. Method for generating an at least partially microstructured surface, comprising the following steps:
    a) provision of a surface that can be microstructured,
    b) provision of a tool according to claim 15,
    c) microstructuring of the surface by means of the tool.

17. Method according to claim 16, comprising the step of curing by the tool a curable material on the surface that can be microstructured.

18. Method according to claim 17, in which the curing takes place through irradiation or heating of the matrix, and comprising the application of a curable material to a substrate or to the matrix by the tool, so that according to step a) a surface that can be microstructured is provided.

19. Object with a multiply curved surface and, in the region of the multiple curvature, an at least partially microstructured surface, wherein the microstructure in the region of the multiple curvature is generated by means of a tool according to claim 10.

20. Tool according to claim 4, wherein the surface material of the first pressure roller has a diameter of 10-50 cm and/or a length of 20-100 cm.

21. Tool according to claim 15, wherein the surface material of the first pressure roller has a diameter of 10-50 cm and/or a length of 20-100 cm.

22. A tool for generating a microstructure on a surface, the tool comprising:
    a pressure roller assembly having at least one pressure roller, the pressure roller assembly being moveably driveable over the surface;
    a matrix having, on one side thereof, a negative of the microstructure to be generated, the matrix being an endless strip disposed around the at least one pressure roller of the pressure roller assembly with the negative of the microstructure facing outwardly; and
    a device for accelerating the curing of a curable material, the curing device being coupled to the pressure roller assembly, wherein, when a center of gravity of the pressure roller assembly executes a movement on the surface, the matrix executes a rolling movement between the at least one pressure roller and the surface, with the negative of the matrix contacting the surface, and wherein the curing device moves along with the pressure roller assembly and acts on a part of the surface over which the pressure roller assembly has been driven.

* * * * *